(12) United States Patent
Greco et al.

(10) Patent No.: US 11,973,060 B2
(45) Date of Patent: Apr. 30, 2024

(54) EXTENDED THROUGH WAFER VIAS FOR POWER DELIVERY IN FACE-TO-FACE DIES

(71) Applicant: NVIDIA Corporation, Santa Clara, CA (US)

(72) Inventors: Joseph Greco, San Jose, CA (US); Joseph Minacapelli, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/458,093

(22) Filed: Aug. 26, 2021

(65) Prior Publication Data
US 2021/0384168 A1  Dec. 9, 2021

Related U.S. Application Data

(63) Continuation of application No. 16/751,061, filed on Jan. 23, 2020, now Pat. No. 11,127,719.

(51) Int. Cl.
*H01L 23/00* (2006.01)
*H01L 23/538* (2006.01)
*H01L 25/065* (2023.01)

(52) U.S. Cl.
CPC ...... *H01L 25/0657* (2013.01); *H01L 23/5384* (2013.01); *H01L 23/5389* (2013.01); *H01L 24/45* (2013.01); *H01L 2225/06541* (2013.01)

(58) Field of Classification Search
CPC ............ H01L 25/0657; H01L 23/5384; H01L 23/5389; H01L 24/45; H01L 2225/06541;
(Continued)

(56) References Cited

U.S. PATENT DOCUMENTS 6,211,056 B1  4/2001  Begley et al.
7,255,801 B2  8/2007  Chen
(Continued)

OTHER PUBLICATIONS

"Three-dimensional integrated circuit", Wikipedia contributors, Retrieved from Internet URL : https://en.wikipedia.org/w/Index.php?title=Three-dimensional_integrated_circuit&oldid=936687690, pp. 18 (2020).
(Continued)

*Primary Examiner* — Elias Ullah
(74) *Attorney, Agent, or Firm* — Taylor English Duma L.L.P.

(57) ABSTRACT

A TSV of a first semiconductor die may extend from a semiconductor substrate of the first semiconductor die through at least one metallization layer of the die to connect to a metallization layer to supply power to the second semiconductor die. By extending the TSV, resistance may be reduced, allowing for enhanced power delivery to the second semiconductor die. Resistance may be further reduced by allowing for the TSV to connect to a thicker metallization layer than would otherwise be possible. Also, in some embodiments, the TSV may connect to a metallization layer that is suitable for supplying power to both semiconductor dies. The first semiconductor die may be a top die or a bottom die in a face-to-face arrangement. Disclosed concepts may be extended to any number of dies included in a die stack that includes the face-to-face arrangement.

20 Claims, 10 Drawing Sheets

(58) Field of Classification Search
CPC .............. H01L 23/481; H01L 23/5227; H01L 23/49816; H01L 23/5385; H01L 2224/08145; H01L 23/645; H01L 2225/06517; H01L 2225/06572
See application file for complete search history.

(56) References Cited

U.S. PATENT DOCUMENTS

| | | | |
|---|---|---|---|
| 7,952,392 | B2 | 5/2011 | Koyama et al. |
| 10,541,230 | B2 | 1/2020 | Higuchi et al. |
| 11,616,023 | B2 | 3/2023 | Greco et al. |
| 11,699,662 | B2 | 7/2023 | Greco et al. |
| 2006/0071332 | A1 | 4/2006 | Speers |
| 2006/0087332 | A1 | 4/2006 | Drost et al. |
| 2007/0139426 | A1 | 6/2007 | Greco et al. |
| 2007/0194415 | A1 | 8/2007 | Seng et al. |
| 2008/0191363 | A1 | 8/2008 | Plants et al. |
| 2008/0309371 | A1 | 12/2008 | Speers |
| 2009/0042365 | A1 | 2/2009 | McDonald |
| 2010/0155938 | A1 | 6/2010 | Martinez et al. |
| 2011/0041329 | A1 | 2/2011 | Tong et al. |
| 2011/0285007 | A1 | 11/2011 | Chi et al. |
| 2012/0049353 | A1 | 3/2012 | Osenbach |
| 2012/0068355 | A1 | 3/2012 | Aoki et al. |
| 2012/0241981 | A1* | 9/2012 | Hirano .................. H01L 23/562 257/777 |
| 2012/0273959 | A1 | 11/2012 | Park et al. |
| 2013/0051116 | A1 | 2/2013 | En et al. |
| 2013/0115734 | A1 | 5/2013 | Tan et al. |
| 2015/0076679 | A1 | 3/2015 | Seng et al. |
| 2015/0118794 | A1 | 4/2015 | Lin et al. |
| 2015/0380392 | A1 | 12/2015 | Pang et al. |
| 2016/0005717 | A1 | 1/2016 | Lin et al. |
| 2016/0172310 | A1 | 6/2016 | Zhai |
| 2016/0181228 | A1 | 6/2016 | Higuchi et al. |
| 2016/0351549 | A1 | 12/2016 | Lin et al. |
| 2017/0025393 | A1 | 1/2017 | Lin et al. |
| 2017/0033082 | A1 | 2/2017 | Lin et al. |
| 2017/0059650 | A1 | 3/2017 | Tipple et al. |
| 2017/0062399 | A1 | 3/2017 | England et al. |
| 2017/0309572 | A1 | 10/2017 | Chi et al. |
| 2018/0005988 | A1 | 1/2018 | Deligianni et al. |
| 2018/0197818 | A1 | 7/2018 | Lin et al. |
| 2019/0019778 | A1 | 1/2019 | Lin et al. |
| 2019/0189797 | A1 | 6/2019 | Zommer |
| 2019/0384884 | A1* | 12/2019 | Thuries .................. G06F 30/392 |
| 2020/0235073 | A1 | 7/2020 | Chen et al. |
| 2021/0175192 | A1 | 6/2021 | Mueller et al. |
| 2023/0230925 | A1 | 7/2023 | Greco et al. |

OTHER PUBLICATIONS

Demerjian, C., "What is Intel's Foveros Tech and What isn't it?", Retrieved from the Internet URL : https://semiaccurate.com/2019/02/11/what-is-intels-foveros-tech-and-what-isnt-it/, accessed on Jan. 31, 2020, pp. 7 (Feb. 11, 2019).

Doyen, L., et al., "Analysis of Power Delivery Network of Multiple Stacked ASICs Using TSV and Micro-bumps", Apache Design Solutions, p. 1 (2020).

Final Office Action dated Sep. 22, 2021 in U.S. Appl. No. 16/751,057, 18 pages.

Final Office Action dated Nov. 1, 2021 in U.S. Appl. No. 16/751,037, 16 pages.

Non-Final Office Action dated Feb. 2, 2022 in U.S. Appl. No. 16/751,057, 15 pages.

Non-Final Office Action dated Mar. 14, 2022 in U.S. Appl. No. 16/751,037, 17 pages.

Greco, Joseph; Applicant-Initiated Interview Summary for U.S. Appl. No. 16/751,057, filed Jan. 23, 2020, dated Jan. 12, 2023, 2 pgs.

Greco, Joseph; Notice of Allowance for U.S. Appl. No. 16/751,057, filed Jan. 23, 2020, dated Mar. 13, 2023, 14 pgs.

Greco, Joseph; Final Office Action for U.S. Appl. No. 16/751,037, filed Jan. 23, 2020, dated Aug. 1, 2022, 24 pgs.

Greco, Joseph; Final Office Action for U.S. Appl. No. 16/751,057, filed Jan. 23, 2022, dated Oct. 19, 2022, 21 pgs.

Greco, Joseph; Notice of Allowance for U.S. Appl. No. 16/751,037, filed Jan. 23, 2020, dated Nov. 23, 2022, 10 pgs.

* cited by examiner

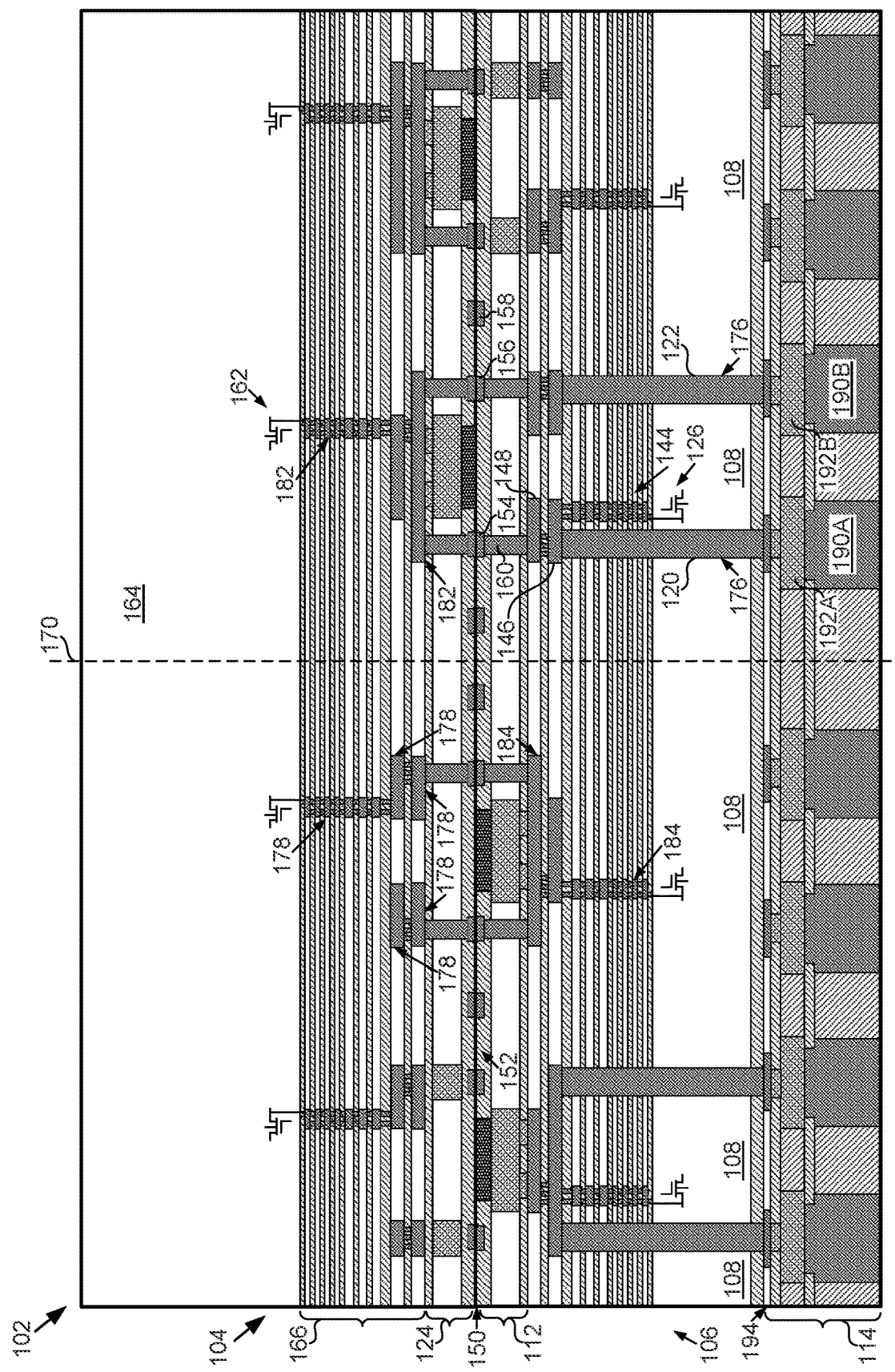

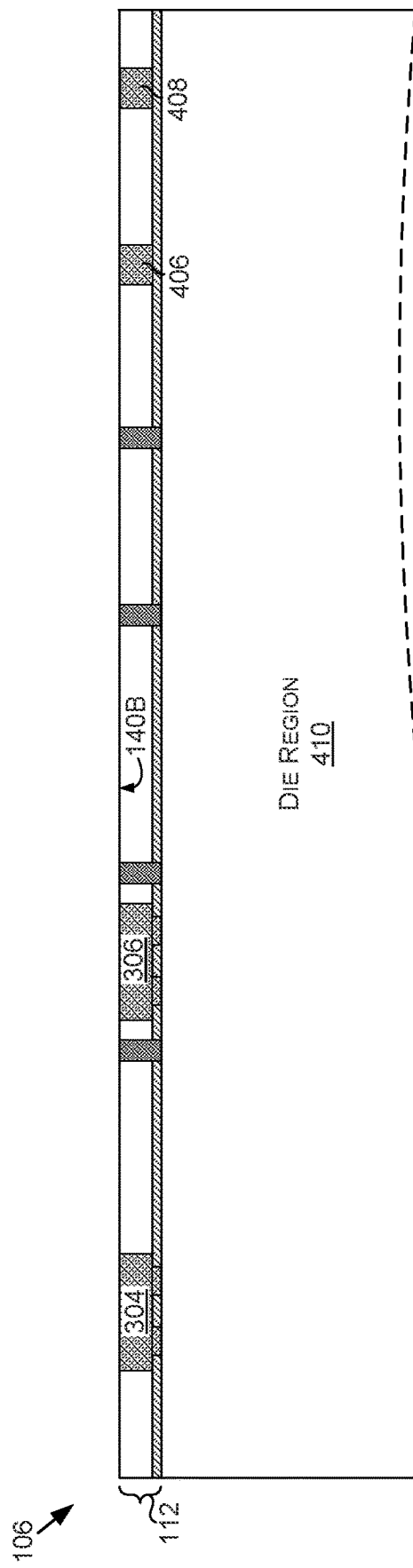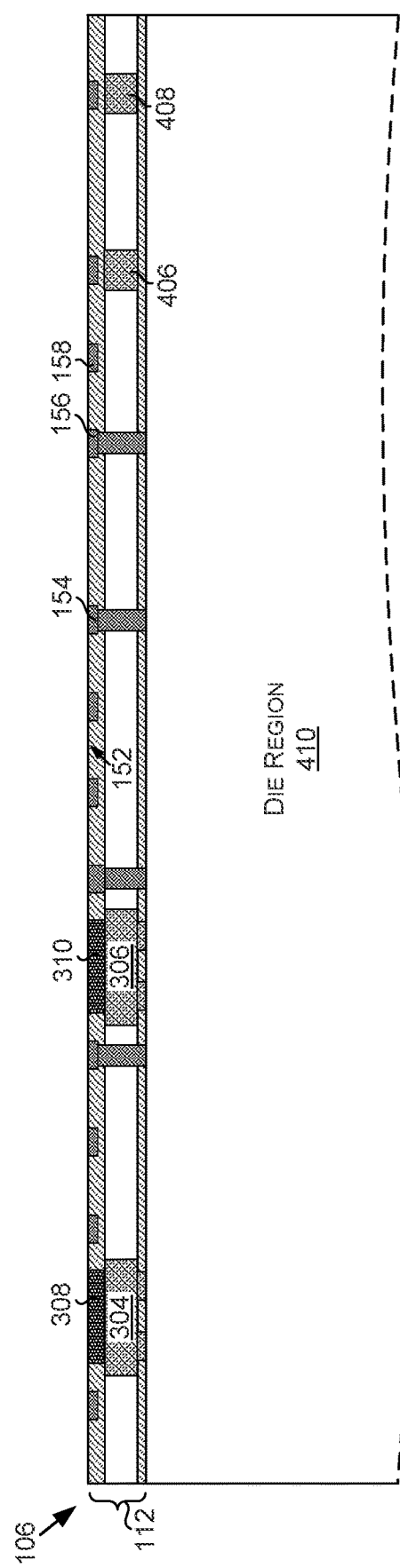

United States Patent No. US 11,973,060 B2

EXTENDED THROUGH WAFER VIAS FOR POWER DELIVERY IN FACE-TO-FACE DIES

RELATED APPLICATIONS

This application is a continuation of U.S. patent application Ser. No. 16/751,061, titled "FACE-TO-FACE DIES WITH ENHANCED POWER DELIVERY USING EXTENDED TSVS," filed Jan. 23, 2020, which is incorporated herein by reference in its entirety.

BACKGROUND

It is sometimes not possible or practical to form a semiconductor device from one integrated substrate (or semiconductor die) that includes all of the circuitry desired for the device. Thus, semiconductor devices have been formed from two or more semiconductor dies. Forming a semiconductor device from multiple dies may be challenging. For example, there may be hundreds to thousands of connections required to transmit signals between chips. To achieve high speed operation, connection resistance should be low with short path lengths to minimize inductive and capacitive effects. Further, as semiconductor devices scale and more transistors are integrated into a device, the power and current levels required to operate the transistors may also increase—thereby making power delivery more challenging. Additionally, semiconductor device yields may be reduced, as the entire multi-die device may need to be discarded after testing. Other challenges include arranging components of semiconductor dies to avoid interference between the components that may degrade device performance.

Multi-die devices are often provided with dies mounted in a face-to-back arrangement. In particular, single dies are often front to back so a stacked arrangement may naturally follow from this configuration by stacking similarly arranged dies. However, using a face-to-back arrangement may require all signals to be communicated between the dies using Through Silicon Vias (TSVs) that extend through the entire bottom die. The size of the TSVs results in a lower density of interconnects between the dies, thereby limiting performance and design flexibility. Further, the dies may be connected using microbumps that require an underfill that compromises the thermal performance of the composite structure.

A face-to-face arrangement may allow for significantly higher density of interconnects between the dies by forming interconnects from bump pad metal. Traditional approaches to supplying power to a die in a face-to-face arrangement of semiconductor dies may deliver power to a top/upper die using TSVs in the semiconductor substrate of the other bottom/lower die. In doing so, power travels through a TSV, then through each metallization layer and interlayer-dielectric layer of the bottom or lower die to reach the top die. This may result in a resistive path that is unable to deliver enough power to the top die, as the path may include a series of thin metallization layers and vias. Other approaches to supplying power to a die may route the power externally to the other die. However, these approaches greatly limit design flexibility and may result in an undesirably large package size.

SUMMARY

The present disclosure relates to approaches for enhancing semiconductor arrangements that include face-to-face semiconductor dies. In some respects, power delivery to a first die in a face-to-face arrangement with a second die may be enhanced by extending a Through Silicon Via (TSV) through at least one metallization layer of the second die to supply power to the first die.

Disclosed approaches provide for a TSV of a first semiconductor die that extends from a semiconductor substrate of the first semiconductor die through at least one metallization layer of the die to connect to a metallization layer to supply power to the second semiconductor die. By extending the TSV, resistance may be reduced, allowing for enhanced power delivery to the second semiconductor die. Resistance may be further reduced by allowing for the TSV to connect to a thicker metallization layer than would otherwise be possible. Also, in some embodiments, the TSV may connect to a metallization layer that is suitable for supplying power to both semiconductor dies.

BRIEF DESCRIPTION OF THE DRAWINGS

The present systems and methods for face-to-face dies with enhanced power delivery using extended TSVs is described in detail below with reference to the attached drawing figures, wherein:

FIG. 1C is a diagram of an example cross-section of a face-to-face arrangement of semiconductor dies, in accordance with some embodiments of the present disclosure;

FIG. 4A is a diagram of an example of a cross-section of a semiconductor die including probe pads for testing prior to including the semiconductor die a face-to-face arrangement of semiconductor dies, in accordance with some embodiments of the present disclosure;

FIG. 4B is a diagram of an example of a cross-section of a semiconductor die including additional interface layers formed over the probe pads of FIG. 4A, in accordance with some embodiments of the present disclosure;

DETAILED DESCRIPTION

Figure 1A:
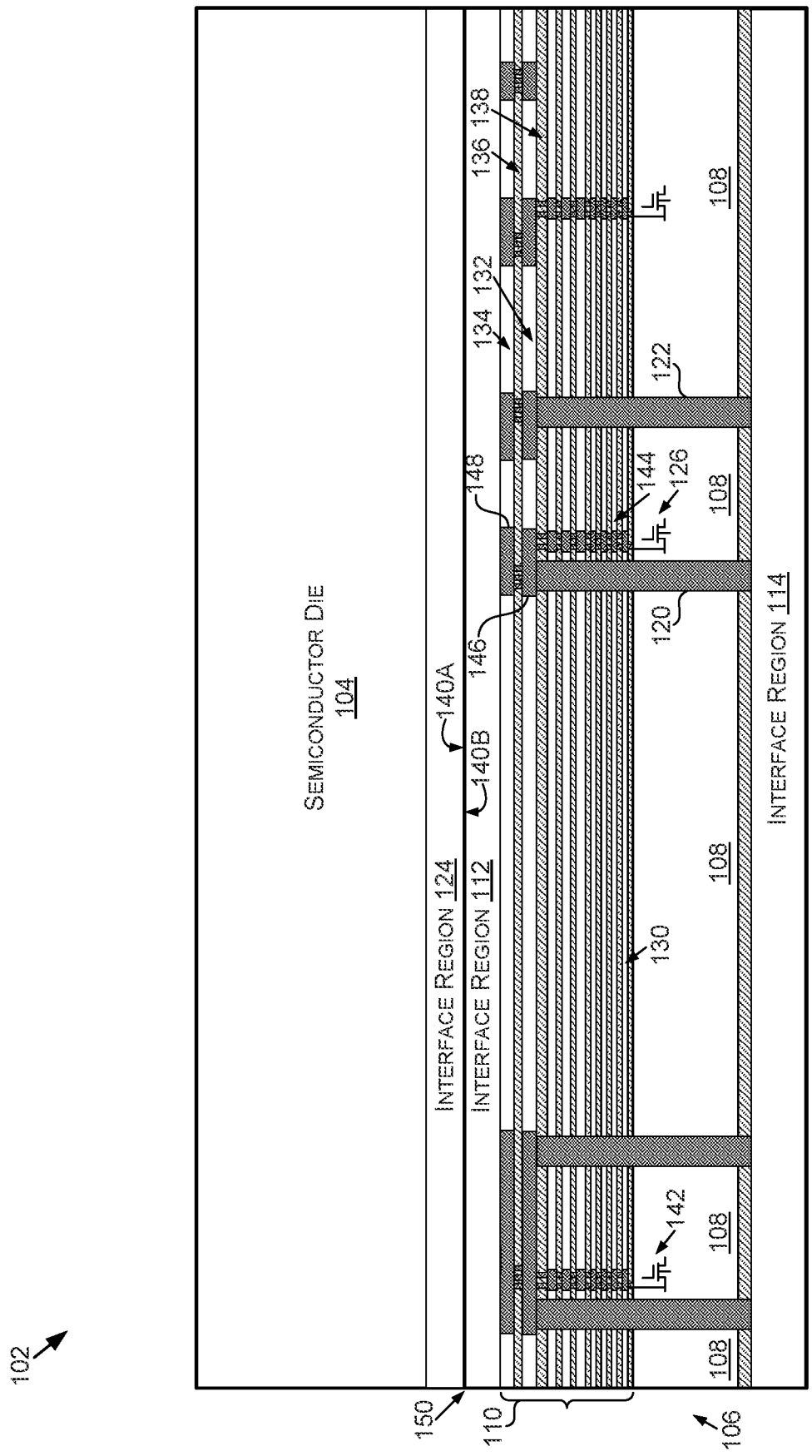
FIG. 1A is a diagram of an example of a cross-section of a face-to-face arrangement of semiconductor dies, in accordance with some embodiments of the present disclosure.

The present disclosure relates to approaches for enhancing semiconductor arrangements that include face-to-face semiconductor dies.

The challenges in forming semiconductor devices from multiple dies has impacted the types of devices, configurations, and components found in multi-die devices. Multi-die devices are often provided with dies mounted in a face-to-back arrangement as this is a natural arrangement of the dies from a design and fabrication standpoint. A face-to-face arrangement may allow for significantly higher density of interconnects between the dies by forming interconnects from bump pad metal, but is a less natural arrangement and introduces significant challenges from a design and fabrication standpoint. For example, semiconductor devices have not used a face-to-face arrangement of semiconductor dies that each include a graphics processing unit (GPU) due to these challenges. In such configurations, many signals may be needed for the GPUs to communicate between chips, the GPU in a semiconductor die may require more power than can practically be delivered, and die sizes may be large enough that yields are prohibitively low. Further, it may be desirable to form one or more inductors over the semiconductor substrate of one or both dies, such as for high speed clock operation and/or power filtering, but interference from an adjacent die may degrade an inductor's performance. As such, these types of inductors have not been used in semiconductor devices with face-to-face die arrangements.

In contrast to conventional approaches, disclosed approaches provide for a TSV of a first semiconductor die that extends from a semiconductor substrate of the first semiconductor die through at least one metallization layer of the die to mechanically and electrically connect to a different metallization layer to supply power to the second semiconductor die. By extending the TSV, resistance at higher layers (layers further from source) may be reduced, allowing for enhanced power delivery to the second semiconductor die. Resistance may be further reduced by allowing for the TSV to connect to a thicker metallization layer than would otherwise be possible. Also, in some embodiments, the TSV may connect to a metallization layer that is suitable for supplying power to both semiconductor dies. The first semiconductor die may be a top die or a bottom die in a face-to-face arrangement. Further, where additional dies are included in a die stack, any number of the dies may include one or more TSVs that extend from a semiconductor substrate of the die through at least one metallization layer of the die to connect to a metallization layer to supply power to another die.

Also in contrast to conventional approaches, one or both semiconductor dies in a face-to-face arrangement may include a probe pad layer formed on a face of each die to allow the die to be individually tested prior to assembly of the dies. Thus, faulty dies may be discarded individually so they are not included in a composite semiconductor device, thereby increasing device yields. The probe pad layer also allows dies to be matched so that a composite semiconductor device achieves desired performance, which may further increase device yields. For example, where each die includes a number of processing cores, testing may be used to bypass faulty cores and select dies so that the composite semiconductor device collectively includes a threshold number of active cores. In some embodiments, each semiconductor die may be tested (e.g., at a fabrication facility pre-dicing), then additional interface layers (e.g., comprising bump pads and dielectric material) may be formed over the probe pad layer and used to bond the semiconductor dies in a face-to-face arrangement to form a composite semiconductor device. The composite semiconductor device may then be tested using a different probe pad layer. In some embodiments, the probe pads of the probe pad layer formed on the face of the die may be used to individually test the die, and may remain inactive during operation of the composite semiconductor device.

In further contrast to conventional approaches, disclosed approaches provide for forming an inductor over the semiconductor substrate of one or both dies in a face-to-face die arrangement while reducing the parasitic capacitance between the inductor and the adjacent die. In disclosed embodiments, the semiconductor device may include a void (e.g., an air gap) between the inductor and the adjacent die to reduce the parasitic capacitance between the inductor and the adjacent die. The void may be etched in interface layers (e.g., comprising bump pads and dielectric material) between the semiconductor dies, and may extend along the length of the inductor.

With reference to FIG. 1A, FIG. 1A is a diagram of an example of a cross-section of a face-to-face arrangement 102 of semiconductor dies, in accordance with some embodiments of the present disclosure. It should be understood that this and other arrangements described herein are set forth only as examples. Other arrangements and elements may be used in addition to or instead of those shown, and some elements may be omitted altogether. Further, the drawings and illustrations in the present application are not necessarily to scale, and do not necessarily indicate actual relative dimensions.

The face-to-face arrangement 102 includes at least a semiconductor die 104 and a semiconductor die 106. The semiconductor die 106 may include a semiconductor substrate 108, a metallization region 110, an interface region 112, and an interface region 114. The semiconductor die 104 may include an interface region 124.

As an overview, the semiconductor die 106 may include any number of Through Silicon Vias (TSVs), such as a TSV 120 and a TSV 122. While the face-to-face arrangement is described with respect to TSVs, such as the TSV 120 and the TSV 122, the TSVs may more generally be referred to as Through Wafer Vias (TWVs) or Through Chip Vias (TCVs), as some embodiments may use a non-silicon material. One or more of the TSVs, such as the TSV 120 may extend from the semiconductor substrate 108 of the semiconductor die 106 through at least one metallization layer of the metallization region 110 to a metallization layer of the metallization region 110 to supply power to the semiconductor die 104 through the metallization layer, the interface region 112 of the semiconductor die 106, and the interface region 124 of the semiconductor die 104. By extending the TSV through at least one metallization layer of the metallization region 110, power distribution to the semiconductor die 104 may be enhanced.

The semiconductor substrate 108 includes semiconductor material, such as single-crystal semiconductor material. In the present example, the semiconductor substrate 108 is a silicon substrate and more particularly is monocrystalline silicon. However, the semiconductor substrate 108 may comprise any suitable semiconductor material(s), such as a group IV semiconductor material or group III-V semiconductor material.

Group IV refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

Group III-V refers to a compound semiconductor including at least one group III element and at least one group V element. By way of example, a group III-V semiconductor may take the form of a III-Nitride semiconductor. III-Nitride or III-N refers to a compound semiconductor that includes nitrogen and at least one group III element such as aluminum (Al), gallium (Ga), indium (In), and boron (B), and including but not limited to any of its alloys, such as aluminum gallium nitride (Al$_x$Ga(1-x)N), indium gallium nitride (In$_y$Ga(1-y)N), aluminum indium gallium nitride (Al$_x$In$_y$Ga(1-x-y)N), gallium arsenide phosphide nitride (GaAsAPbN(1-a-b)), aluminum indium gallium arsenide phosphide nitride (Al$_x$In$_y$Ga(1-x-y)AsAPbN(1-a-b)), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures.

One or more electronic circuits may be formed, at least partially within the semiconductor substrate 108. An electronic circuit may include one or more transistors, such as a transistor 126. In the present example, the electronic circuit may form at least a portion of a GPU. For example, the semiconductor die 106 may be a GPU die. However, various types and configurations of electronic circuits are contemplated as being within the score of the present disclosure. As some examples, the semiconductor substrate 108 may include one or more circuit components of a processing unit, a Central Processing Unit (CPU), a single transistor (e.g., a power transistor), a logic circuit, a power circuit, a System on Chip (SoC), and a transmitter and/or receiver. Where the semiconductor substrate 108 includes a processing unit, the processing unit may include any number of cores. For example, where the processing unit is a GPU, the GPU may include multiple Streaming Multiprocessors (SMs) and each Streaming Multiprocessor may include a number cores.

The metallization region 110 may be formed on the semiconductor substrate 108 and comprise any number of metallization layers and interlayer dielectric layers. Of the metallization layers shown in FIG. 1A, a metallization layer 130, a metallization layer 132, and a metallization layer 134 are individually labeled. Also, of the interlayer dielectric layers shown in FIG. 1A, an interlayer dielectric layer 136 and an interlayer dielectric layer 138 are individually labeled. The metallization layers of the metallization region 110 may interconnect the various circuit components and/or electronic circuits of the semiconductor die 106 and/or the semiconductor die 104. The number of the metallization layers included in the metallization region 110 and the thickness of those layers may vary depending on the design of the semiconductor die 106 and the circuit components and electronic circuits included in the semiconductor die 106. Generally, the thickness of the metallization layers may remain constant, or may increase toward a face 140A of the semiconductor die 106 and a face 140B of the semiconductor die 104. As a specific example, the metallization region 110 may include sixteen metallization layers. The bottom six metallization layers (e.g., including the metallization layer 130) may have the same thickness, followed by four metallization layers that are (as a non-limiting example) three to four times thicker than the bottom metallization layers, followed by two metallization layers (e.g., the metallization layers 132 and 134) that are (for example and without limitation) ten times thicker than the bottom metallization layers.

In various examples, different metallization layers may be used for different purposes, which may depend on the thickness of the metallization layers. The density of routing operations which may be performed using a metallization layer may decrease as the thickness of a metallization layer increases. However, the resistivity of a metallization layer may also decrease as the thickness of a metallization layer increases. Thus, in some examples, thicker metallization layers, such as the metallization layers 132 and 134 may be configured for power distribution and/or global clock distribution. Thinner metallization layers, such as the metallization layer 130 may be configured for local signal routing, such as to connect local transistors (e.g., to the transistor 126). Other metallization layers (e.g., with a thickness between the metallization layer 130 and the metallization layers 132 and 134) may be configured for bussing (e.g., between an electronic circuit comprising the transistor 126 and an electronic circuit comprising a transistor 142), lower level clock distribution, and/or power routing.

Face-to-Face Dies with Enhanced Power Delivery Using TSVs

As described herein, one or more TSVs, such as the TSV 122 and/or the TSV 120 may extend from the semiconductor substrate 108 of the semiconductor die 106 through at least one metallization layer of the metallization region 110 to a metallization layer of the metallization region 110 to supply power to the semiconductor die 104 to the metallization layer, and the components provided throughout the metallization layer. In the example shown, the TSV 120 extends through the metallization layer 130 and each metallization layer below the metallization layer 132 in the metallization region 10 to contact the metallization layer 132. However, in other examples a TSV may extend through any number of metallization layers to contact any metallization layer of the metallization region 110. For example, where the metallization region 110 includes two metallization layers, the TSV may extend through the bottom metallization layer to contact the top metallization layer. Also, in the example shown, rather than contacting the metallization layer 132, the TSV may contact the metallization layer 134 or any other metallization layer above the metallization layer 130.

By extending the TSV through at least one metallization layer of the metallization region 110, power distribution to the semiconductor die 104 may be enhanced. For example, this may reduce the resistance of the power supply path to the semiconductor die 104, as a TSV typically has low resistance. The power supply path may run from the interface region 114 of the semiconductor die 106 to the TSV 120, through the metallization layer 132 (e.g., a metallization segment 146), through vias in the interlayer dielectric layer 136, through the metallization layer 134 (e.g., a metallization segment 148), and through the interface region 112 to the interface region 124 of the semiconductor die 104. Resistance may further be reduced by allowing for the TSV to connect to a thicker metallization layer than would otherwise be possible. For example, the metallization layer 130 may be the thinnest and most highly resistive of the metallization layers in the metallization region 110, and may be bypassed by extending the TSV 120 through the metallization layer 130.

The number of metallization layers in the metallization region 110 that a TSV is extended through and the thickness of the metallization layer that the TSV contacts may vary depending on the design of the face-to-face arrangement 102 and the circuit components and electronic circuits included in the face-to-face arrangement 102. For example, these factors may vary depending on the routing and layout requirements of the face-to-face arrangement 102, as extending a TSV may introduce routing blockage in the metallization region 110. Also, these factors may vary depending on the power distribution requirements of the face-to-face arrangement 102. In the example shown, the TSV 120 is configured to supply power to circuit components in both the semiconductor die 104 and the semiconductor die 106. For example, from the metallization layer 132, power may be distributed to circuit components such as the transistor(s) 126 through a routing path 144 in the metallization region 110 to reach the semiconductor substrate 108. The routing path 144 includes metallization arranged in a column, but this arrangement may vary.

In the present example, the semiconductor die 104 and the semiconductor die 106 have substantially the same power distribution requirements. For example, the semiconductor die 104 and the semiconductor die 106 may include the same electronic circuitry. Thus, the TSV 120 is configured to deliver substantially the same power to the semiconductor die 104 and the semiconductor die 106. However, the TSV 120 may in other examples be configured to deliver more power to the semiconductor die 104 than the semiconductor die 106 or more power to semiconductor die 106 than the semiconductor die 104. In some embodiments, the TSV 120 may be configured to deliver power to the semiconductor die 104, but not to the semiconductor die 106 or not to a circuit component in the semiconductor substrate 108 of the semiconductor die 106. Also, while the TSV 120 and the TSV 122 both contact the same metallization layer in the example shown, different TSVs within the semiconductor die 106 may extend through a different number of metallization layers to contact different metallization layers.

In various embodiments, the interface region 112 of the semiconductor die 106 may be formed on the metallization region 110 and may electrically and mechanically couple the semiconductor die 106 to the semiconductor die 104. For example, the semiconductor die 104 may be mounted face-to-face with the semiconductor die 106 to form an electrical and mechanical interface 150 at the interface region 112 of the semiconductor die 106 and the interface region 124 of the semiconductor die 104.

Figure 1B:
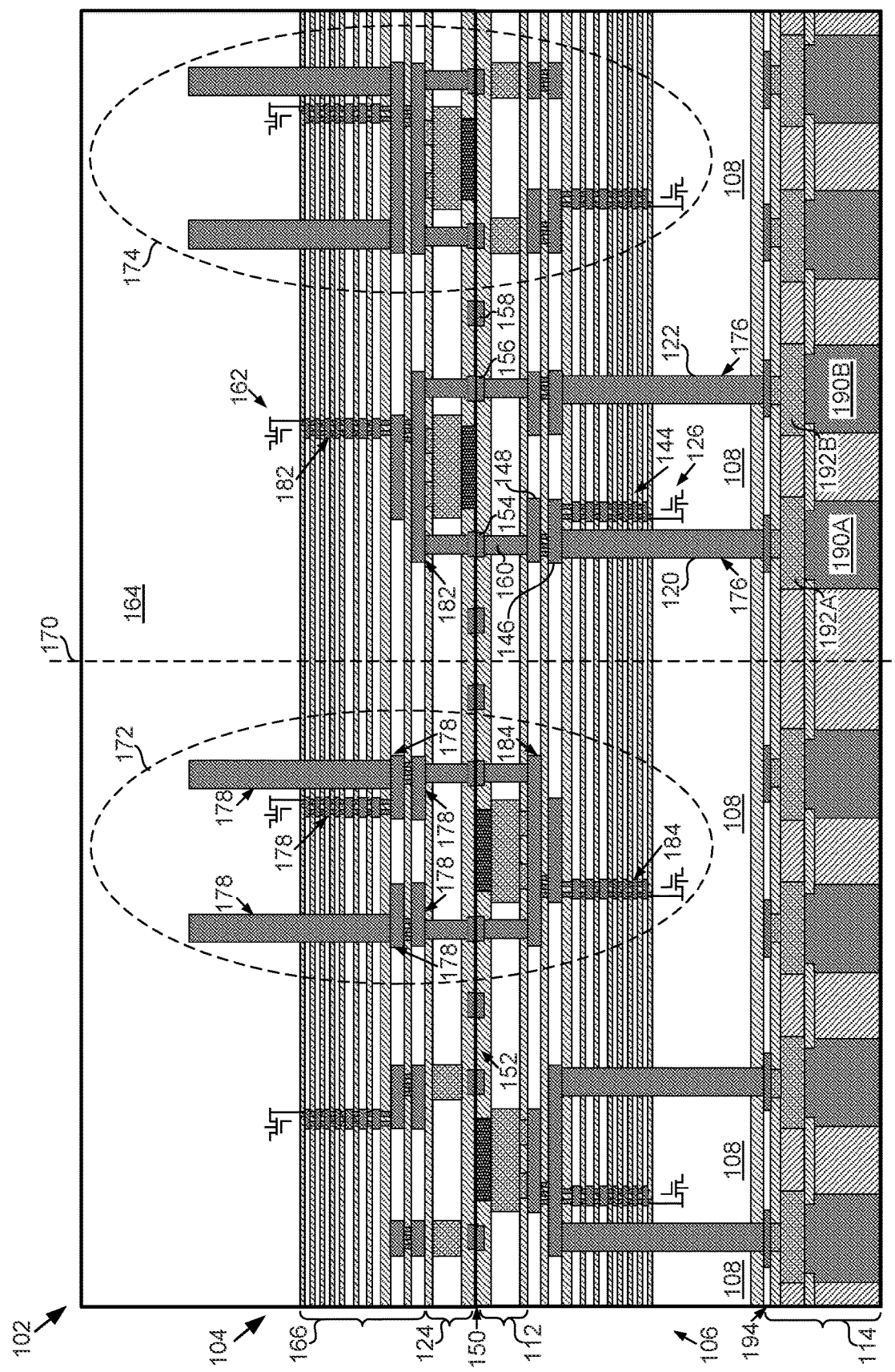
FIG. 1B is a diagram of an example of a cross-section of a face-to-face arrangement of semiconductor dies, in accordance with some embodiments of the present disclosure.

Various techniques may be used to form the interface region 112 of the semiconductor die 106 and the interface region 124 of the semiconductor die 104 so as to provide the electrical and mechanical interface 150. The interface region 112 and the interface region 114 may vary depending on various factors, such as the desired characteristics for the electrical and mechanical interface 150. As an example, the interface region 112 and the interface region 114 may use a different technique and/or comprise different materials when only power is to be transferred across the electrical and mechanical interface 150, as opposed to a signal(s) and power. FIG. 1B shows an example of the interface region 112 and the interface region 114 along with an example of the semiconductor die 104.

With reference to FIG. 1B, FIG. 1B is a diagram of an example of a cross-section of a face-to-face arrangement 102 of semiconductor dies, in accordance with some embodiments of the present disclosure. In the example of FIG. 1B, the interface region 112 and the interface region 114 each include bonding dielectric (e.g., bonding oxide) and inter-die interface pads (e.g., formed from one or more bump pad layers and/or inter-die interface pad layers) that forms the electrical and mechanical interface 150. By way of example, the bonding dielectric may include a bonding dielectric layer 152 (e.g., a bonding oxide layer). Also by way of example, inter-die interface pads may include bump pads in the bonding dielectric layer 152, of which bump pads 154, 156, and 158 are individually labeled. The bump pads 154 and 156 may be used to supply power to the semiconductor die 104 and the interface region 112. Bump pad vias, such as a bump pad via 160, may be used to connect the bump pads 154 and 156 to the metallization layer 134. The bump pad 158 may, for example, be used to communicate a signal between the semiconductor die 104 and the semiconductor die 106. Any number of bump pads may be used to facilitate the exchange of power and/or signals between the semiconductor die 104 and the semiconductor die 106.

The interface region 124 of the semiconductor die 104 may be similar to the interface region 112 of the semiconductor die 106, with similarly depicted elements representing corresponding features in the interface region 112. However, in other examples, the interface region 124 may include different elements than the interface region 112. As indicated in FIG. 1B, the interface region 124 of the semiconductor die 104 may receive power from the TSV 120, which may be delivered to an electrical circuit(s) comprising one or more circuit components, such as a transistor 162 formed at least partially in a semiconductor substrate 164 of the semiconductor die 104 (e.g., using one more metallization layers in a metallization region 166).

The description of the semiconductor substrate 108 and the semiconductor die 106 may apply to the semiconductor substrate 164 and the semiconductor die 104 and is therefore not repeated. However, the examples may be mixed and matched such that the semiconductor substrate 108 may comprise similar or different material than the semiconductor substrate 164. Similarly, the description of the metallization region 110 and the semiconductor die 106 may apply to metallization region 166 and the semiconductor die 104 and is therefore not repeated (e.g., the same or a different number of layers may be included of similar or different thicknesses). However, in some embodiments the semiconductor die 104 does not include the metallization layers 166 and/or may include a single metallization layer.

In the example of FIG. 1B, the semiconductor die 106 and the semiconductor die 104 may be fabricated using the same mask set and the same base wafer material. This allows for reduced cost by avoiding an additional mask set. Further, device yields may be increased, for example, as fabrication can be tailored to a single design.

As an example of fabricating the face-to-face arrangement 102, a wafer comprising the semiconductor substrate 108 may be processed to fabricate the semiconductor die 106 comprising the metallization region 110. The interface region 112 may be formed on the metallization region 110 and the wafer may be diced, or singulated, to form individual dies including the semiconductor die 106.

Also, a different wafer comprising the semiconductor substrate 164 may be processed to fabricate the semiconductor die 104 comprising the metallization region 166. This processing may use the same mask set used for the semiconductor die 106 (or a different mask set in some embodiments). The interface region 124 may be formed on the metallization region 166. This processing may use the same mask set as used for the interface region 112 of the semiconductor die 106, or a different mask set. A pick and place machine may be used to mount the singulated dies formed from the semiconductor substrate 108 with the respective unsingulated dies formed from the semiconductor substrate 164 in face-to-face arrangements. This may form the faceto-face arrangement 102. The singulated dies may then be thinned and the TSVs, such as the TSV 120 and the TSV 122 may be revealed. Subsequently, the interface region 114 may be formed and the face-to-face arrangements may be singulated.

In some embodiments, the semiconductor die 104 is bilaterally symmetrical to the semiconductor die 106 (and/or the mask set(s) used to form the semiconductor dies 104 and 106), as indicated by symmetry line 170. When mounting the semiconductor die 106 and the semiconductor die 106 in the face-to-face arrangement 102, the semiconductor die 106 may be rotated and flipped around the symmetry line 170 (like book pages) to align symmetrically-positioned contact points on the interface regions 112 and 124. Other types of symmetry are covered by the disclosure, such as quadrilateral symmetry and/or rotational symmetry. For example, the semiconductor die 106 may be rotated 180 degrees and flipped around the symmetry line 170 to align symmetrical contact points on the interface regions 112 and 124.

Where the semiconductor dies (and/or masks and/or surface contacts on the face of the dies) are symmetrical, in some embodiments, one or more structures in the semiconductor die 106 may have a corresponding structure in the semiconductor die 104 that is configured for a different purpose or function than in the semiconductor die 106. For example, FIG. 1B shows a structure 176 of the semiconductor die 106 (including at least the TSVs 120 and 122, connected metallization segments, such as the metallization segments 146 and 148, and connected microvias, such as those of the routing path 144), which may correspond to a structure 178 of the semiconductor die 104. In some embodiments, the structure 176 for purposes of this description does not refer to connected components (e.g., the bump pad via 160 and the bump pads 154 and 156) in the interface region 112, while in others it may. For example, the interface region 124 and the interface region 112 may not include analogous and/or duplicate structure. In the semiconductor die 106, the structure 176 may be configured to supply power to the semiconductor die 104 (e.g., using bump pad vias in the interface region 112, such as the bump pad via 160 and bump pads, such as the bump pads 154 and 156). In the semiconductor die 104, the structure 178 may be configured to supply power to an electronic circuit in the semiconductor substrate 164 (e.g., via a portion of the structure 178 that is analogous to and/or a copy of the routing path 144), may remain unused or inactive as a vestigial structure (e.g., not used to carry signals and/or power), or may be configured to perform a different function, such as to supply power to a semiconductor die (e.g., via one or more portions of the structure 178 that correspond to the TSVs 120 and/or 122) and/or electrical component on the semiconductor die 104 (e.g., via the interface region 124 which may be configured similar to or different than the interface region 112 with respect to bump pad vias and bump pads) in embodiments that include those additional elements.

FIG. 1B also shows a structure 182 (e.g. including connected metallization segments and microvias) of the semiconductor die 104, which may correspond to a structure 184 of the semiconductor die 106. Similar to the structures 176 and 178, the structures 182 and 184 may be an example of one or more corresponding structures that are configured for a different purpose or function for the semiconductor dies 104 and 106. Also similar to the structures 176 and 178, in some embodiments, the structures 182 and 184 for purposes of this description do not refer to connected components (e.g., bump pad vias and bump pads in the interface regions 112 and 124, while in others they may. As indicated by a region 172, the structures 178 and 184 may be configured to connect and/or align across the semiconductor dies 104 and 106. A similar configuration is shown for a region 174. In some embodiments, such regions may be vestigial and may not be used for characterization of the face-to-face arrangement 102.

While the structure 176 and the structure 178 are substantially similar in FIG. 1B, the corresponding structures may be different from one another. For example, even where the same masks are used to form the structures in the semiconductor dies 104 and 106, the corresponding structures may be different. As an example, TSVs may not be formed in the semiconductor die 104, the region 172, and/or the region 174. Thus, the structure 178 may not include TSVs that correspond to the TSVs 120 and 122 of the structure 176. Additionally or alternatively, portions of the structure 178 in the interface region 124 may be different than portions of the structure 176 in the interface region 112 (or no portion of the structure 178 may be in the interface region 124).

FIG. 1B also shows an example of the interface region 114 of the semiconductor die 106. In the example of FIG. 1B, the interface region 114 includes microbumps, such as a microbump 190A and a microbump 190B, which may serve as power and/or Input/Output (10) terminals of the face-to-face arrangement 102. For example, the microbump 190A and the microbump 190B may be configured as power supply terminals of the face-to-face arrangement 102. The interface region 114 may further include one or more backside redistribution layers, such as a backside redistribution layer 194. The interface region 114 may vary depending on such factors as the packaging used to house the face-to-face arrangement 102, fabrication constraints or technologies, whether the semiconductor die 104 or the semiconductor die 104 is the top die or the bottom die in the face-to-face arrangement 102, and/or whether there are additional semiconductor dies (e.g., in a face-to-face arrangement) and/or electrical components stacked on the face-to-face arrangement 102, etc.

Figure 2:
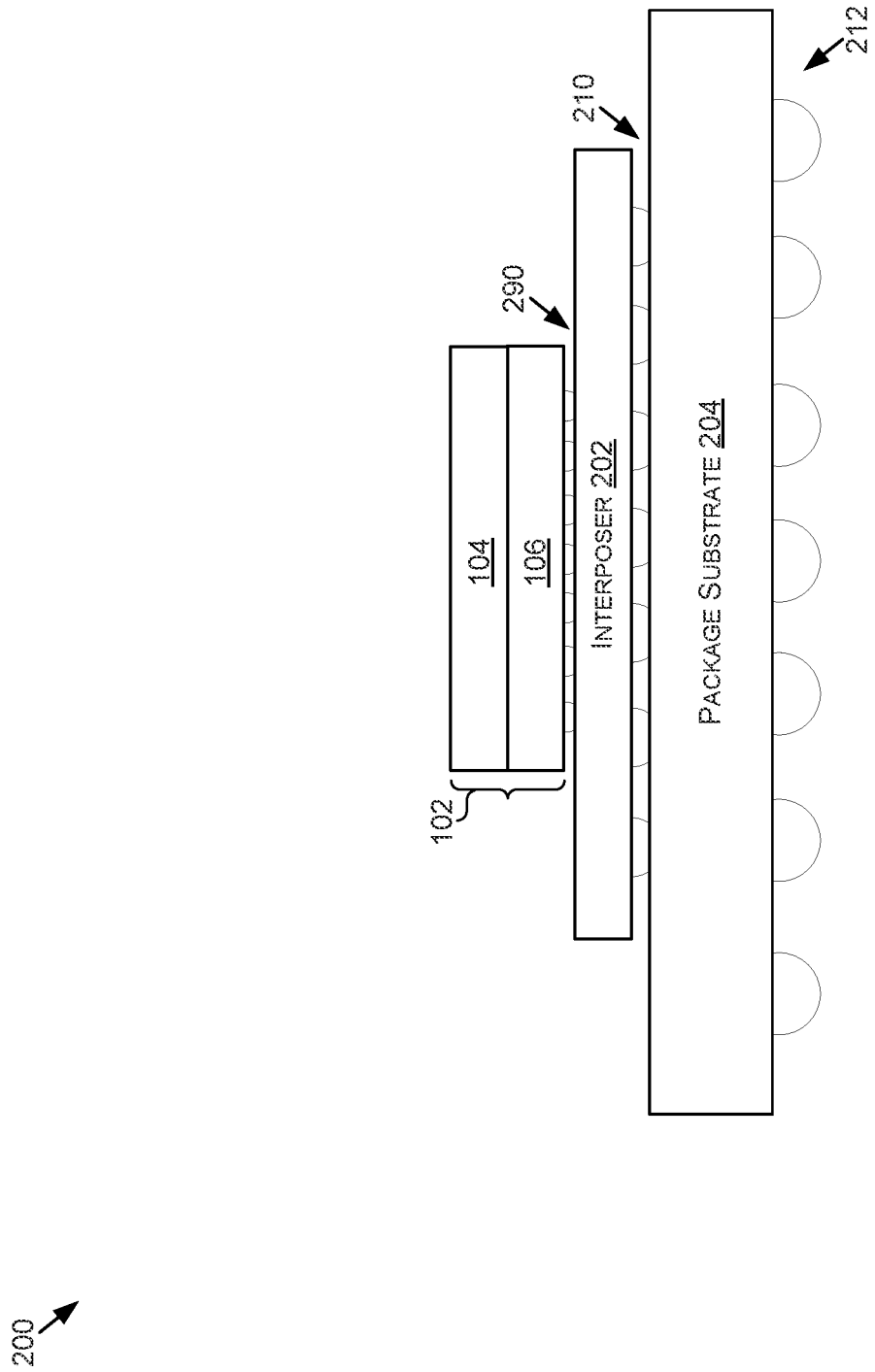
FIG. 2 is a diagram of an example of a cross-section of a semiconductor package that includes a face-to-face arrangement of semiconductor dies, in accordance with some embodiments of the present disclosure.

Now referring to FIG. 2, FIG. 2 is a diagram of an example cross-section of a semiconductor package 200 that includes a face-to-face arrangement 102 of semiconductor dies, in accordance with some embodiments of the present disclosure. In the semiconductor package 200, the face-to-face arrangement 102 is electrically and mechanically coupled to an interposer 202 by microbumps 290, which may include the microbumps 190A and 190B of FIG. 1B. The interposer 202 may be electrically and mechanically coupled to a package substrate 204 by solder bumps 210, which may be C4 bumps. Also, the package substrate 204 includes solder balls 212, which may serve as terminals or pins of the semiconductor package 200. The semiconductor package 200 may include other elements not shown, such as encapsulant and additional dies and/or electrical components. One or more of the solder balls 212 may be a package power supply terminal of the semiconductor package 200, and may be electrically connected to the interface region 114 of the semiconductor die 106, such as by the microbump 190A and the microbump 190B. One or more of the solder balls 212 may also be a package signal, or IO terminal of the semiconductor package 200, and may be electrically connected to the interface region 114 of the semiconductor die 106, such as by one or more of the microbumps 290. The semiconductor package 200 is provided as one suitable example of a semiconductor package, but other packaging types and technologies may be used in disclosed embodiments.

Face-to-Face Dies with a Void for Enhanced Inductor Performance

Figure 3A:
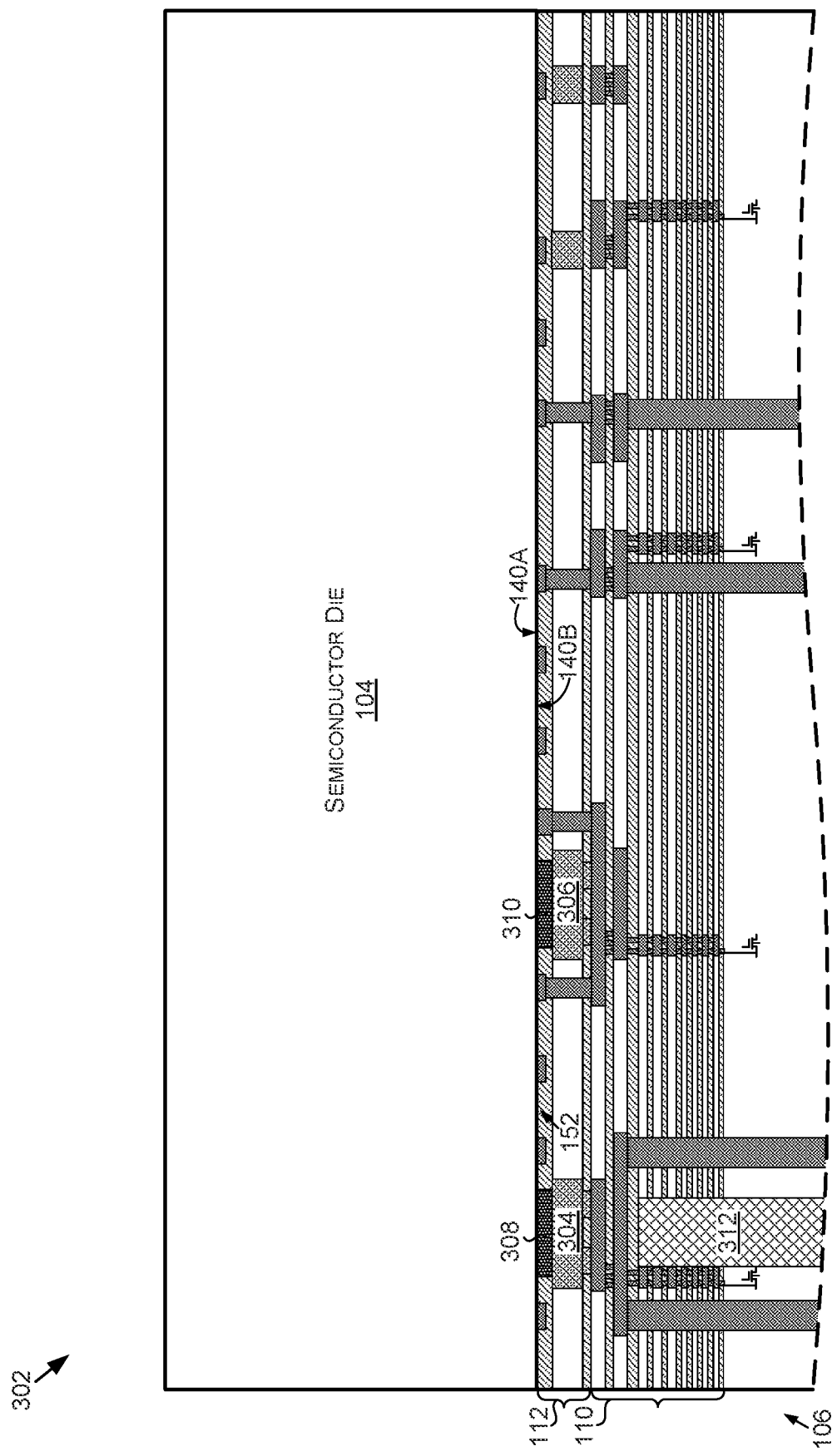
FIG. 3A is a diagram of an example of a cross-section of a face-to-face arrangement of semiconductor dies that includes a void for an inductor, in accordance with some embodiments of the present disclosure.

Aspects of the disclosed approaches provide for forming an inductor over a semiconductor substrate of one or both dies in a face-to-face die arrangement while reducing the parasitic capacitance between the inductor and the adjacent die. In disclosed embodiments, the semiconductor device may include a void (e.g., an air gap) between the inductor and the adjacent die to reduce the parasitic capacitance between the inductor and the adjacent die. The void may be etched in interface layers (e.g., comprising inter-die interface pads and dielectric material) between the semiconductor dies, and may extend along the length of the inductor. FIG. 3A shows one such example of a suitable face-to-face arrangement of semiconductor dies, but many different variations are within the score of the present disclosure.

Now referring to FIG. 3A, FIG. 3A is a diagram of an example cross-section of a face-to-face arrangement 302 of semiconductor dies that includes a void for an inductor, in accordance with some embodiments of the present disclosure.

The face-to-face arrangement 302 may be the same as or different than the face-to-face arrangement 102 of FIGS. 1A and/or 1B. In the face-to-face arrangement 302, one or more inductors may be formed over the semiconductor substrate 108 of the semiconductor die 106. Examples in FIG. 3A include an inductor 304 and an inductor 306. The inductors 304 and 306 may be included in the face-to-face arrangement 302 for, as examples, high speed clock operation and/or power filtering (e.g., of power received from a power supply terminal of the face-to-face arrangement 302). In embodiments where the inductor 304 and/or the inductor 306 are used for clocking, the inductor may connect to phase-locked loop (PLL) circuitry (to generate a clock signal) and may not include a connection to a TSV (or a power supply path) and/or to outside of the semiconductor package 200.

In the example shown, the inductors 304 and 306 are formed in the interface region 112. In other examples, one or more inductors may in addition or instead be formed in a different region, such as the metallization region 110. As shown, the face-to-face arrangement 302 includes a void 308 between the inductor 304 and the semiconductor die 104 and a void 310 between the inductor 306 and the semiconductor die 104. The voids 308 and 310 may be an air gap configured to reduce the parasitic capacitance between the inductors 304 and 306 and the semiconductor die 104. The voids 308 and 310 may extend along the length of the inductors 304 and 306 respectively along a direction parallel to the face 140A of the semiconductor die 106. The voids 308 and 310 may also extend from a distal plane on the face 140A of the semiconductor die 106 to the inductors 304 and 306 respectively. For example, the voids 308 and 310 may be formed in the surface of the interface region 112 by etching the voids 308 and 310 in the bonding dielectric layer 152. In other examples, the voids may be etched in additional or different portions of the interface region 112. Also in some embodiments, the voids 308 and 310 may be formed at least partially on the semiconductor die 104. In some examples, the inductor 304 or 306 is at least partially on a distal plane on the face 140A of the semiconductor die 106, and the void 308 or 310 is formed on a distal plane on the face 140B of the semiconductor die 104 rather than on the semiconductor die 106 (e.g., by etching the void(s) in the interface region 124).

Figure 3B:
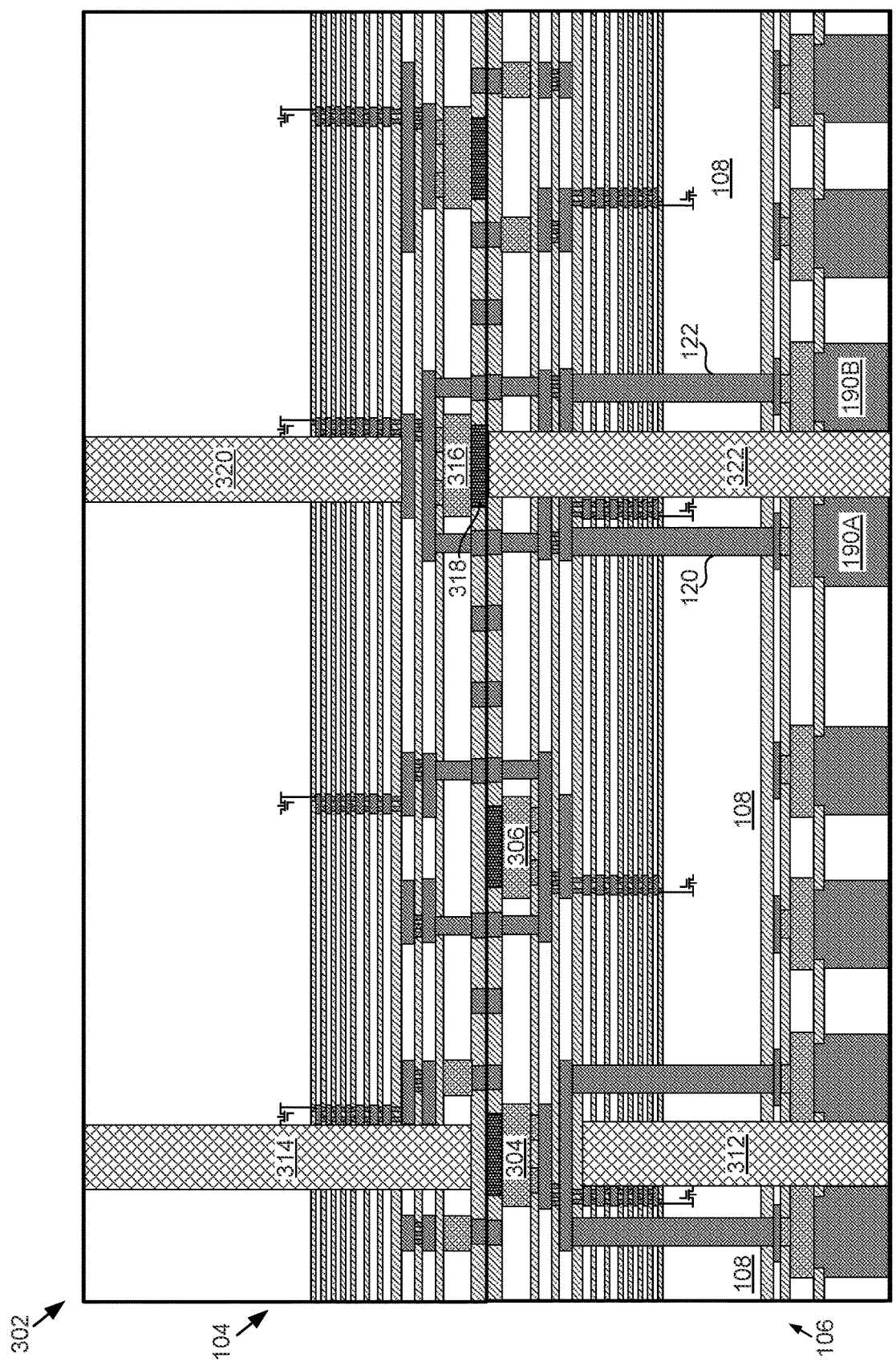
FIG. 3B is a diagram of an example of a cross-section of a face-to-face arrangement of semiconductor dies that includes a void for an inductor, in accordance with some embodiments of the present disclosure.

The semiconductor die 106 may also include a voided region between the inductor and the backside of the semiconductor die 106 to avoid parasitic capacitance between the inductor and elements of the semiconductor die 106. For example, a voided region 312 is shown, which may extend to the backside of the semiconductor die 106. The voided region 312 may also extend along the length of the inductor 304, similar to the void 308. The voided region 312 is configured to be floating. Thus, while conductive material, such as metallization may be in the voided region 312 (e.g., as fill material to satisfy design rules), the conductive material is floating (e.g., comprising non-signal carrying layers) so as to avoid parasitic capacitance with the inductor 304. FIG. 3B is used to describe additional examples of the face-to-face arrangement 302.

FIG. 3B is a diagram of an example cross-section of the face-to-face arrangement 302 of semiconductor dies that includes a void for an inductor, in accordance with some embodiments of the present disclosure. As shown in FIG. 3B, the semiconductor die 104 may also include a voided region 314 for the inductor 304, which may be similar to the voided region 312. FIG. 3B also shows an example where the semiconductor die 104 includes an inductor 316, a void 318, and a voided region 320, which may be similar to or different than the inductor 304, the void 308, and the voided region 312, respectively. Further, the semiconductor die 106 includes a voided region 322, which may be similar to the voided region 314. Thus, one or both of the semiconductor dies 104 or 106 may include an inductor and corresponding void. Further, the inductor and void may be formed in different layers in each semiconductor die. Also, in various embodiments, an inductor (e.g., the inductor 304, 306, and/or 316) may optionally be formed in one semiconductor die and connected to electronic circuitry (e.g., to provide a clock, etc.) in the other die in addition to or instead of the semiconductor die. While like FIG. 3B, FIG. 1B shows the inductors and voids, the face-to-face arrangement 102 may be provided without one or more of those elements. Also, while like FIG. 1B, FIG. 3B shows TSVs that extend through at least one metallization layer, the face-to-face arrangement 302 may be provided without one or more of those elements.

Face-to-Face Dies with Probe Pads for Pre-Assembly Testing

Aspects of the disclosed approaches provide for one or both semiconductor dies in a face-to-face arrangement including at least one probe pad layer formed on a face of the die to allow the die to be individually tested prior to assembly of the dies. Thus, faulty dies may be discarded individually so they are not included in a composite semiconductor device, or dies may be better matched, thereby increasing device yields. In some embodiments, a semiconductor die may be tested (e.g., at a fabrication facility pre-dicing), then additional interface layers (e.g., comprising inter-die interface pads and dielectric material) may be formed over the probe pad layer and used to bond the semiconductor dies in a face-to-face arrangement to form a composite semiconductor device. FIGS. 4A and 4B show one such example used to describe testing, then forming additional interface layers over a semiconductor die prior to including the semiconductor die a face-to-face arrangement of semiconductor dies, but many different variations are within the score of the present disclosure.

FIG. 4A is a diagram of an example cross-section of the semiconductor die 106 including probe pads for testing prior to including the semiconductor die 106 in the face-to-face arrangement 102 of semiconductor dies, in accordance with some embodiments of the present disclosure. The semiconductor die 106 of FIGS. 4A and 4B may correspond to the semiconductor die 106 during fabrication and pre-assembly into the face-to-face arrangement 102.

The interface region 112 of FIG. 4A is formed on a die region 410 on the face 140B of the semiconductor die 106. The die region 410 is shown generically to indicate the broad applicability of the approaches described with respect to FIGS. 4A and 4B, but may in some embodiments include the metallization region 110 and the semiconductor substrate 108. In some embodiments, the interface region 114 is not yet formed on the semiconductor die 106.

The interface region 112 of FIG. 4A includes a plurality of probe pads, of which probe pads 406 and 408 are shown. The probe pads may comprise, for example, aluminum probe pads formed from a probe pad layer(s). In embodiments where the interface region 112 includes at least one inductor, such as the inductor 304 or the inductor 306, one or more of the inductors may also be formed from the probe pad layer(s), as shown, and/or from a different layer(s). The probe pads may be configured to test one or more electronic circuits in the semiconductor die 106, such as an electronic circuit comprising the transistor 126 and/or 142. For example, the probe pads may be electrically connected to the electronic circuit(s) by the metallization region 110 for testing. As an example, the semiconductor die 106 may be tested prior to dicing, along with other similar semiconductor dies on the wafer. Further, this testing may occur at the fabrication facility used to fabricate the wafer.

Subsequent to testing the wafer comprising the semiconductor die 106, the wafer may undergo further processing (e.g., at the fabrication facility) to produce the semiconductor die 106 of FIG. 4B. FIG. 4B is a diagram of an example cross-section of the semiconductor die 106 including additional interface layers formed over the probe pads of FIG. 4A, in accordance with some embodiments of the present disclosure. The additional processing may include forming one or more bonding dielectric layers, such as the bonding dielectric layer 152 over the probe pad layer and/or probe pads. Additionally, any number of inter-die interface pads, such as the bump pads 154, 156, or 158 may be formed in the bonding dielectric layer 152. Further, in embodiments that include one or more inductors, voids—such as the voids 308 or 310—may be formed in the bonding dielectric layer 152. The semiconductor die 106 may then be mounted to the semiconductor die 104 in the face-to-face arrangement 102 using the bonding dielectric layer 152.

In the face-to-face arrangement 102, the probe pads of the probe pad layer may be insulated from the semiconductor die 104 and may remain inactive during operation of the semiconductor die 106. Thus, the probe pads may only be operated for testing of the semiconductor die 106 pre-assembly, but may remain as vestiges in the face-to-face arrangement 102. In other examples, the probe pads may be configured or reconfigured for operation of the semiconductor die 106 and/or the semiconductor die 104 in the face-to-face arrangement 102.

While FIGS. 4A and 4B are described with respect to the semiconductor die 106, FIGS. 4A and 4B may also apply to the semiconductor die 104. For example, the interface region 124 of the semiconductor die 104 may be formed similar to the interface region 112, including testing the semiconductor die 104 at the fabrication facility, then performing additional processing to arrive at the configuration of FIG. 4B. However, in some embodiments the semiconductor die 104 may include probe pads in the interface region 124 while the semiconductor die 106 does not include probe pads in the interface region 112, or the semiconductor die 106 may include probe pads in the interface region 112 while the semiconductor die 104 does not include probe pads in the interface region 124.

To form the face-to-face arrangement 102, the wafer comprising the semiconductor die 106 may be singulated and a pick and place machine may be used to mount the singulated dies formed from the semiconductor substrate 108 with the respective unsingulated dies formed from the semiconductor substrate 164 in face-to-face arrangements including the face-to-face arrangement 102. In embodiments where the semiconductor substrate includes TSVs, the singulated dies may then be thinned and the TSVs, such as the TSV 120 and the TSV 122 may be revealed. Subsequently, the interface region 114 may be formed and the face-to-face arrangements may be singulated. The interface region 114 may be used to test the semiconductor die 104 and/or the semiconductor die 106, such as by testing a composite semiconductor device formed from the semiconductor die 104 and the semiconductor die 106 (e.g., in the semiconductor package 200 and/or prior to inclusion in a semiconductor package). This testing may occur at a testing facility separate from the fabrication facility and may use microbumps in the interface region 114, such as the microbump 190A and/or the microbump 190B (e.g. power and signal terminals used during regular operation) and/or may use backside probe pads in the interface region 114, such as a probe pad 192A and/or a probe pad 192B formed in a backside probe pad layer (e.g. prior to formation of the microbumps). As the semiconductor dies may be tested pre-assembly, faulty dies may be discarded so they are not included in a face-to-face arrangement and/or dies may be matched, thereby increasing device yields.

Figure 4C:
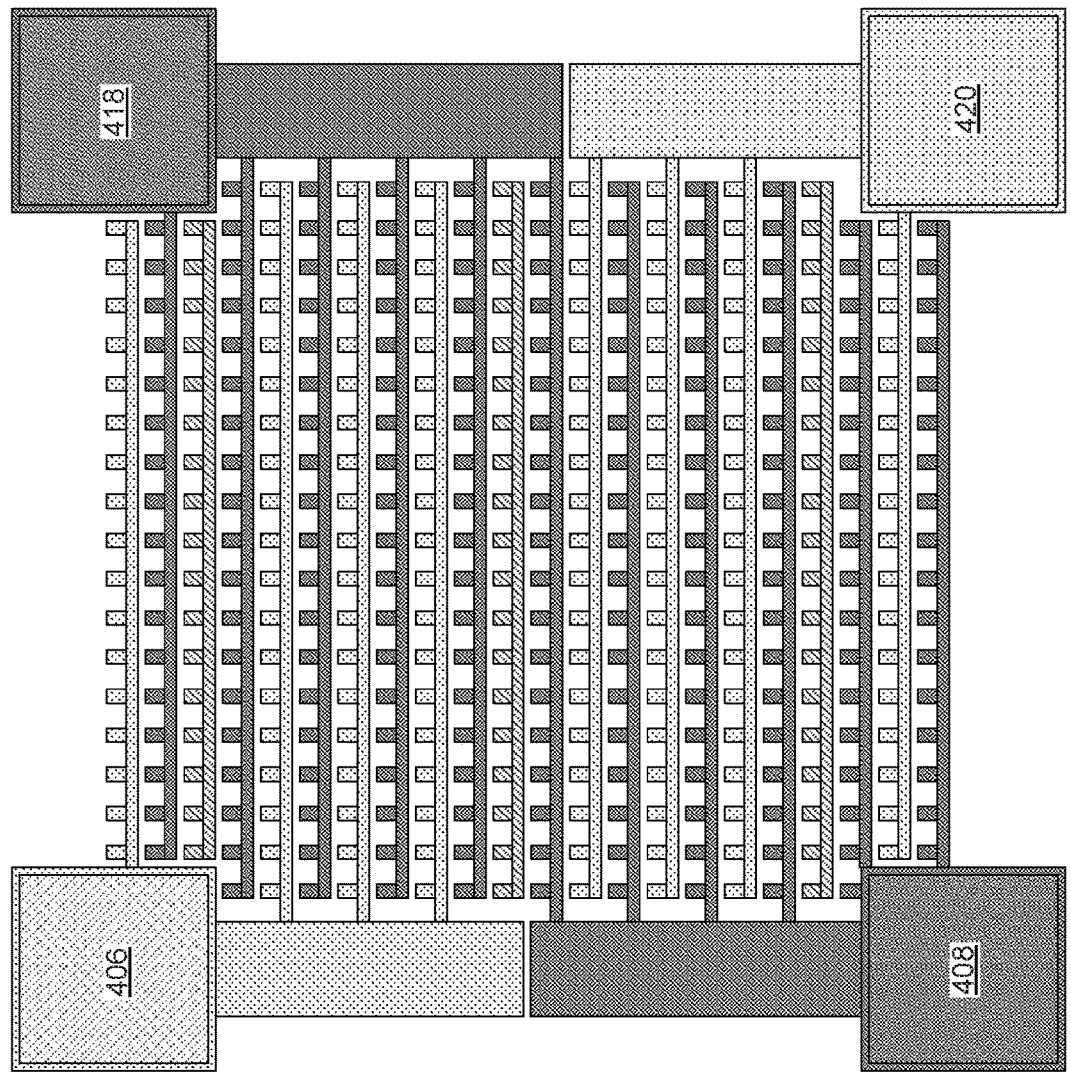
FIG. 4C is a diagram of an example of a top view of a testing tile structure which may be included in a semiconductor die, in accordance with some embodiments of the present disclosure.

Referring now to FIG. 4C, FIG. 4C is a diagram of an example top view of a testing tile structure 416 which may be included in semiconductor die 106, in accordance with some embodiments of the present disclosure. The semiconductor die 106 may include any number of testing tile structures, which may appear similar to the testing tile structure 416 and may be arranged in a grid-like arrangement. The testing tile structure 416 includes the probe pads 406 and 408, as well as a probe pad 418 and a probe pad 420. In other embodiments the testing tile structure 416 may include a different number of probe pads. During testing, pins of testing hardware may electrically and mechanically interface with the testing tile structure 416 at the probe pads. As an example, the probe pads may each be approximately 50×50 microns, and larger than the inter-die interface pads (e.g., the bump pads 154, 156, and 158).

The probe pad 406 may be configured as a power supply terminal of the testing tile structure 416 and the probe pad 408 may be configured as a ground pad of the testing tile structure 416 during the testing. Further, the probe pads 418 and 420 may be configured as respective signal terminals of the testing tile structure 416 during the testing. While the testing tile structure 416 includes two signal terminals in the example shown, the testing tile structure 416 may be used to test more than two signals in the semiconductor die 106 by serializing the signals. Each probe pad may be electrically connected to a respective portion of a redistribution layer, as shown in FIG. 4C. In the example shown, the portions of the redistribution layer include interdigitated fingers. Each node on a finger may be coupled to an underlying via and routed to a corresponding circuit element(s) in the semiconductor substrate 108 (e.g., the transistor 126). While the testing tile structure 416 is shown, embodiments of the present disclosure may not use a testing tile structure for testing. Also, the semiconductor die 104 may include a similar or different testing structure.

Figure 4D:
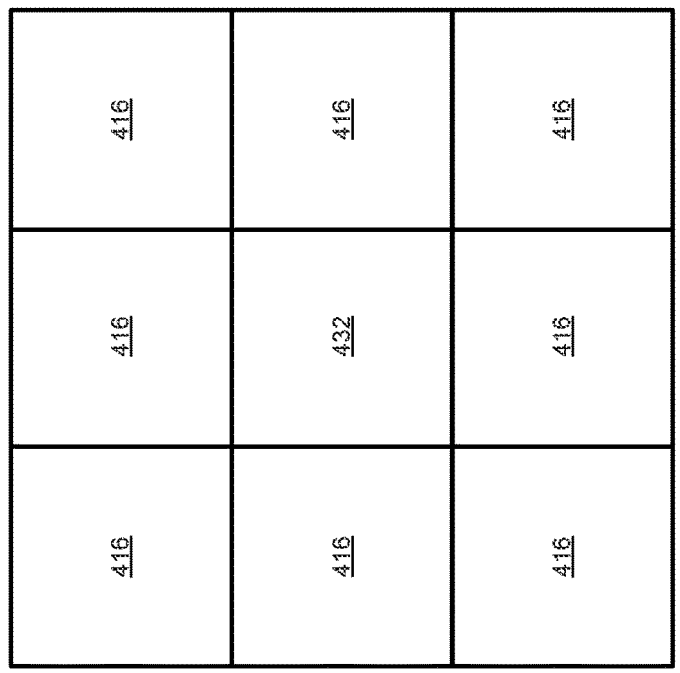
FIG. 4D is a diagram of an example of a top view of an arrangement of testing tile structures which may be included in a semiconductor die, in accordance with some embodiments of the present disclosure.
Figure 4D:
Figure 5:
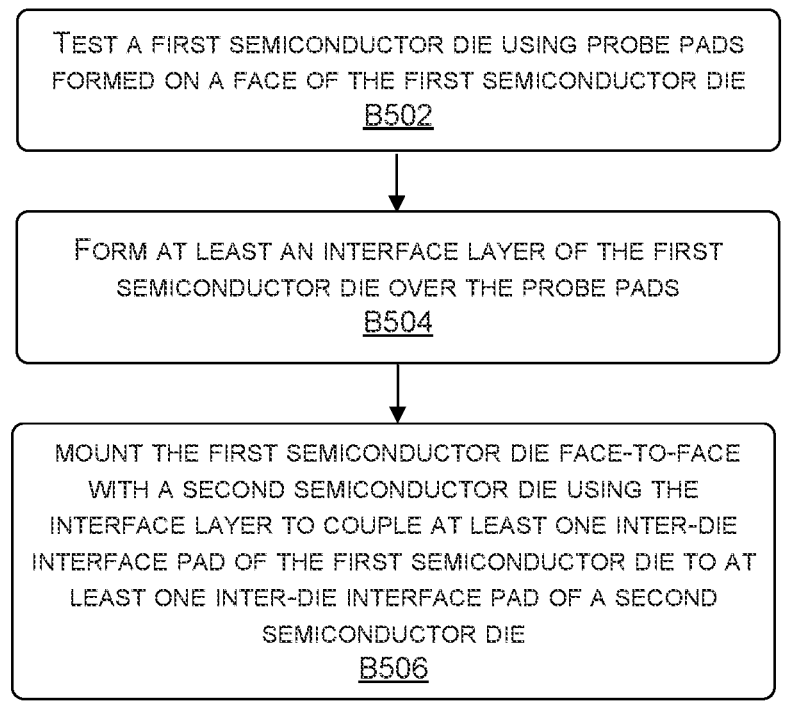
FIG. 5 is a flow diagram showing a method for testing at least one semiconductor die prior to assembly in a face-to-face arrangement with another semiconductor die, in accordance with some embodiments of the present disclosure.

Referring now to FIG. 4D, FIG. 4D is a diagram of an example of a top view of an arrangement 430 of testing tile structures 416 which may be included in the semiconductor die 106, in accordance with some embodiments of the present disclosure. While only eight testing tile structures 416 are shown in FIG. 4D, the semiconductor die 106 may include, as an example, thousands of testing tile structures 416. In a specific and non-limiting example, the semiconductor die 106 may by approximately 20 millimeters by 20 millimeters and a testing tile structure 416 may be approximately 200 micrometers by 200 micrometers. Thus, as many as 10,000 testing tile structures 416 may fit in the arrangement 430. However, in the present example, the region 432 does not include a testing tile structure 416. Instead, the region 432 may include one or more other testing tile structures and/or testing structures, or may not include any probe pads or testing structures. In some examples, the region 432 corresponds to a crossbar configured for inter-die communication of signals between the semiconductor die 104 and the semiconductor die 106 in the face-to-face arrangement 102. The crossbar may be used to communicatively couple a processing unit in the semiconductor die 104 with a processing unit in the semiconductor die 106.

Although FIGS. 4C and 4D are described with respect to the semiconductor die 106, FIGS. 4C and 4D may also apply to the semiconductor die 104. For example, the semiconductor die 104 may include similar or different testing structures (e.g., tiles) as the semiconductor die 104 in a similar or different arrangement.

In embodiments where the semiconductor die 106 comprises a processing unit, the testing tile structures 416 may each correspond to one or more respective processing cores of the processing unit (e.g., that underlines the testing tile structure 416). Using the testing tile structures 416, each processing core(s) may be individually tested. For example, where the semiconductor die 106 comprises a GPU, each testing tile structure 416 may correspond to a respective SM and may be used to test the SM. The semiconductor die 106 may be configured (e.g., by the testing hardware) to bypass faulty cores and/or SMs based on the testing the semiconductor die 106. Further, the semiconductor die 106 may be matched to another component for inclusion in a face-to-face arrangement based on the testing of the semiconductor die 106. For example, the semiconductor die 106 and the semiconductor die 104 may each be tested and selected for inclusion in the face-to-face arrangement 102 based on the number of cores and/or SMs that pass the testing (and/or other performance characteristics identified by the testing). This may be done so that the composite semiconductor device collectively includes a threshold number of active cores or otherwise satisfies predetermined performance criteria.

Thus, various approaches for enhancing semiconductor arrangements that include face-to-face semiconductor dies have been provided herein. These approaches may be mixed and matched in any suitable combination in order to achieve semiconductor devices with desired characteristics.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

The invention claimed is:

1. A semiconductor device comprising:
   a first semiconductor die including therein,
      a semiconductor substrate,
      a metallization layer, and
      a Through Wafer Via (TWV); and
   a second semiconductor die electrically connected to the first semiconductor die via the TWV;
   wherein the first semiconductor die is face-to-face mounted with the second semiconductor die such that the metallization layer of the first semiconductor die is situated between the semiconductor substrate of the first semiconductor die and the second semiconductor die;
   wherein the TWV of the first semiconductor die extends through the metallization layer; and
   wherein the TWV of the first semiconductor die does not extend to the second semiconductor die.

2. The semiconductor device of claim 1, wherein the TWV extends through the metallization layer to terminate at a second metallization layer of the first semiconductor die to supply power to at least one transistor in the semiconductor substrate of the first semiconductor die.

3. The semiconductor device of claim 1, wherein the TWV extends from the semiconductor substrate of the first semiconductor die through the metallization layer to terminate at a second metallization layer of the first semiconductor die to supply power to the second semiconductor die.

4. The semiconductor device of claim 1, wherein the TWV extends through the metallization layer to provide power distribution to a plurality of cores of a processing unit disposed on the semiconductor substrate of the first semiconductor die.

5. The semiconductor device of claim 1, wherein the TWV is electrically connected to a metallization layer of the second semiconductor die that provides power distribution to a plurality of cores of a processing unit disposed on a semiconductor substrate of the second semiconductor die.

6. The semiconductor device of claim 1, wherein the TWV terminates at a conductive layer in the first semiconductor die to provide global clock distribution to a processing unit disposed on the semiconductor substrate of the first semiconductor die.

7. The semiconductor device of claim 1, wherein the TWV extends through the metallization layer to supply power to at least one transistor in a semiconductor substrate of the second semiconductor die through a bump pad interface between the first semiconductor die and the second semiconductor die, the bump pad interface formed over the TWV on the first semiconductor die.

8. The semiconductor device of claim 1, wherein the first semiconductor die is fabricated using a same mask set as the second semiconductor die.

9. The semiconductor device of claim 1, wherein the TWV extends from the semiconductor substrate of the first semiconductor die through the metallization layer to supply power to one or more inductors configured to perform power filtering.

10. The semiconductor device of claim 1, wherein the TWV extends through the metallization layer to power a first graphics processing unit (GPU) disposed on the first semiconductor die and a second GPU disposed on the second semiconductor die.

11. The semiconductor device of claim 10, wherein the first semiconductor die is a first graphics processing unit (GPU) die and the second semiconductor die is a second GPU die.

12. A semiconductor device comprising:
a first semiconductor die including therein,
a semiconductor substrate,
a metallization layer, and
a Through Wafer Via (TWV);
a second semiconductor die electrically connected to the first semiconductor die via the TWV; and
an interface mounting the first semiconductor die face-to-face with the second semiconductor die and electrically connecting the first semiconductor die to the second semiconductor die;
wherein the TWV of the first semiconductor die extends through the metallization layer; and
wherein the TWV of the first semiconductor die does not extend to the second semiconductor die through the interface.

13. The semiconductor device of claim 12, wherein the interface includes a bump pad of the first semiconductor die electrically and mechanically connected to a bump pad of the second semiconductor die.

14. The semiconductor device of claim 12, wherein the first semiconductor die is fully symmetrical with the second semiconductor die.

15. The semiconductor device of claim 12, wherein the TWV extends through the metallization layer to supply power to a processing unit in the first semiconductor die and to a processing unit in the second semiconductor die.

16. A semiconductor package comprising:
a first semiconductor die including therein,
a metallization layer,
a semiconductor substrate, and
a Through Wafer Via (TWV);
a second semiconductor die; and
a package power supply terminal to power the first semiconductor die and the second semiconductor die using the TWV, wherein the TWV of the first semiconductor die extends from within the semiconductor substrate through the metallization layer toward the second semiconductor die to terminate within the first semiconductor die;
wherein the first semiconductor die is face-to-face mounted with the second semiconductor die such that the metallization layer of the first semiconductor die is situated between the semiconductor substrate of the first semiconductor die and the second semiconductor die.

17. The semiconductor package of claim 16, wherein the package power supply terminal comprises at least one electrical contact of a ball grid array substrate that supports the first semiconductor die and the second semiconductor die.

18. The semiconductor package of claim 16, wherein the package power supply terminal is to power a first graphics processing unit (GPU) in the first semiconductor die and a second GPU in the second semiconductor die using the TWV.

19. The semiconductor package of claim 16, wherein the TWV is electrically connected to a bump pad of the first semiconductor die and a bump pad of the second semiconductor die.

20. The semiconductor package of claim 16, wherein the TWV is electrically connected to the package power supply terminal by a backside redistribution layer of the first semiconductor die.

* * * * *